US007708568B1

(12) United States Patent
Wang et al.

(10) Patent No.: US 7,708,568 B1
(45) Date of Patent: May 4, 2010

(54) CONNECTOR ASSEMBLY

(75) Inventors: Chin-Chou Wang, Taipei Hsien (TW); Hsin-Tsung Ho, Taipei Hsien (TW)
(73) Assignee: Cheng Uei Precision Industry Co., Ltd., Taiper Hsien (TW)

( * ) Notice: Subject to any disclaimer, the term of this patent is extended or adjusted under 35 U.S.C. 154(b) by 0 days.

(21) Appl. No.: 12/610,543

(22) Filed: Nov. 2, 2009

(51) Int. Cl.
*H01R 12/00* (2006.01)
*H05K 1/00* (2006.01)

(52) U.S. Cl. ........................................................ 439/83

(58) Field of Classification Search ................... 439/83, 439/79, 76.1
See application file for complete search history.

(56) References Cited

U.S. PATENT DOCUMENTS 7,314,383 B1 * 1/2008 Ho et al. ..................... 439/353

* cited by examiner

*Primary Examiner*—Javaid Nasri
(74) *Attorney, Agent, or Firm*—WPAT, P.C.; Anthony King

(57) ABSTRACT

A connector assembly adapted for electrically connecting with a mating plug connector includes a socket connector and a PCB. The socket connector has an insulating housing defining a front surface, a rear surface and a lateral surface. The front surface is formed with an inserting recess for receiving the mating plug connector. The lateral surface has a receiving groove communicating with the inserting recess. The rear surface has a receiving slot communicating with the inserting recess. A first terminal has a base plate received in the receiving groove and a first soldering plate exposing outside the insulating housing. A second terminal includes a fixing plate fixed in the receiving slot and a second soldering plate exposing outside the insulating housing. The PCB has two soldering portions. Two conductors are provided for connecting the first soldering plate and the second soldering plate with the soldering portions, respectively.

10 Claims, 4 Drawing Sheets

CONNECTOR ASSEMBLY

BACKGROUND OF THE INVENTION

1. Field of the Invention

The present invention relates to a connector assembly, and more particularly to a connector assembly having a socket connector and a printed circuit board.

2. The Related Art

In general, a conventional connector assembly includes a printed circuit board (PCB) and a socket connector soldered on the PCB. The socket connector has an insulating housing and a plurality of terminals mounted in the insulating housing. Each of the terminals has a soldering plate extending outside the insulating housing for being soldered on the PCB. Conventionally, the socket connector is positioned on a top of the PCB, and the soldering plates are attached to and soldered on the PCB for forming the electrical connection between the socket connector and the PCB. Nevertheless, with the electronic devices developing toward miniaturization and multifunction, such assembling structure between the PCB and the socket connector is not flexible and even restricts the renewal and advance of the electronic device. So there is a need to provide a connector assembly that overcomes the above-mentioned problem.

SUMMARY OF THE INVENTION

Accordingly, an object of the present invention is to provide a connector assembly adapted for electrically connecting with a mating plug connector. The connector assembly includes a socket connector and a printed circuit board. The socket connector has an insulating housing defining a front surface, a rear surface opposite to the front surface, and a lateral surface connecting with the front surface and the rear surface. The front surface is formed with an inserting recess for receiving the mating plug connector. The lateral surface has a receiving groove communicating with the inserting recess. The rear surface has a receiving slot communicating with the inserting recess. A first terminal has a base plate received in the receiving groove, a contacting portion projecting into the inserting recess, and a first soldering plate exposing outside the insulating housing. A second terminal has a fixing plate fixed in the receiving slot, a center pin prolonging into the inserting recess, and a second soldering plate exposing outside the insulating housing. The printed circuit board defines two soldering portions. Two conductors are adapted for connecting the first soldering plate and the second soldering plate with the two soldering portions respectively, and capable of altering the relative position between the socket connector and the printed circuit board.

As described above, the socket connector is soldered on the printed circuit board by the conductors, without stacking the socket connector on a top of the printed circuit board, which makes the printed circuit board dispose at any wanted position in an electronic device. So the assembling structure is simple and flexible and meets the tendency towards miniaturization and multifunction of the electrical device.

BRIEF DESCRIPTION OF THE DRAWINGS

The present invention will be apparent to those skilled in the art by reading the following description of an embodiment thereof, with reference to the attached drawings, in which.

DETAILED DESCRIPTION OF THE EMBODIMENT

Figure 5:
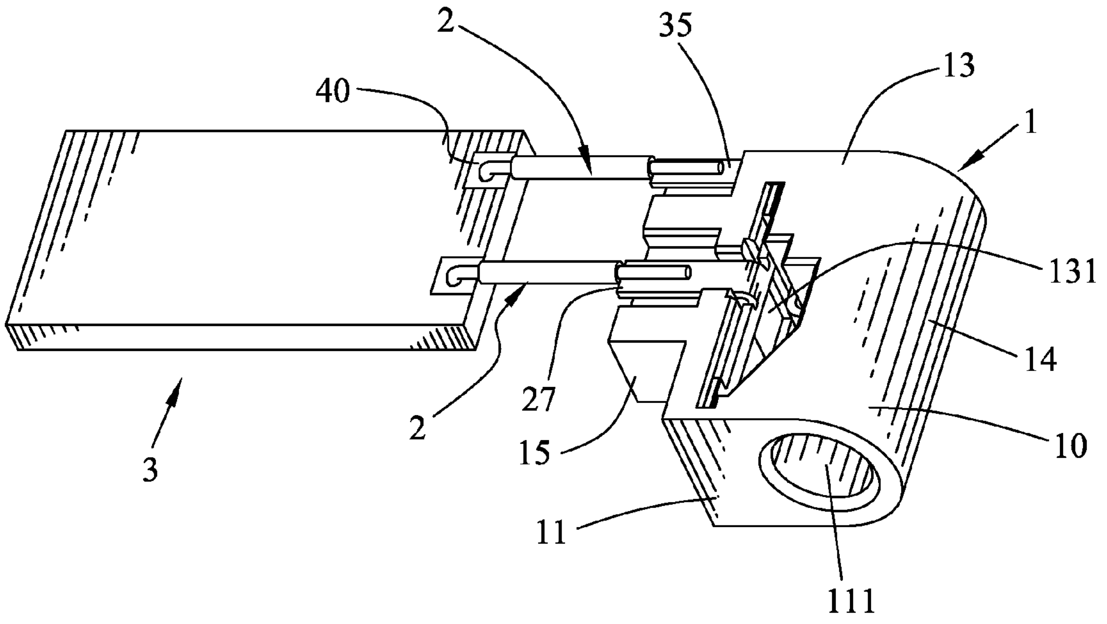
FIG. 5 is a perspective view of the connector assembly.

With reference to FIG. 5, a connector assembly according to the present invention includes a socket connector 1, two conductors 2, and a printed circuit board (PCB) 3.

Please refer to FIGS. 1-4, the socket connector 1 has a substantial rectangular insulating housing 10, a first terminal 20 and a second terminal 30, which terminals are both mounted into the insulating housing 10. The insulating housing 10 defines a front surface 11, a rear surface 12 opposite to the front surface 11, a lateral surface 13 and a top surface 14. The top surface 14 is an arch shape and connects with the front surface 11, the rear surface 12 and the lateral surface 13.

The front surface 11 has an inserting recess 111, with a circular cross-section, at an upper portion thereof, for receiving a mating plug connector (not shown). The inserting recess 111 defines a bottom surface 112, which has a through hole 113 at a substantial center thereof. The through hole 113 extends rearwards and passes through the rear surface 12 of the insulating housing 10. The lateral surface 13 has a receiving groove 131 communicating with the inserting recess 111. The receiving groove 131 includes a fixing slot 1311 extending perpendicularly to the front surface 11 and a connecting groove 1312 above and communicating with the fixing slot 1311. The connecting groove 1312 defines a first surface 1313 perpendicular to an extending direction of the fixing slot 1311, and a second surface 1314 facing the first surface 1313 and extending obliquely and upwardly toward the first surface 1313. The first surface 1313 has a lower portion extended opposite to the second surface 1314 to form a stopping recess 1315.

Please refer to FIGS. 1-4 again, the insulating housing 10 has a projecting block 15 extended downwards from a bottom surface thereof. A lateral surface 151 and a rear surface 152 of the projecting block 15 are substantially flush with the lateral surface 13 and the rear surface 12 of the insulating housing 10, respectively. The lateral surface 151 of the projecting block 15 is formed with a first soldering recess 153 at a substantial middle portion thereof. The first soldering recess 153 penetrates a bottom of the projecting block 15, and passes through the lateral surface 13 to reach a bottom of the fixing slot 1311. Herein, the first soldering recess 153 is substantially T-shaped. The rear surface 12 of the insulating housing 10 has a substantial rectangular receiving slot 121 extending perpendicularly to the lateral surface 13 and communicating with the through hole 113, and a second soldering recess 122. The second soldering recess 122 extends perpendicularly downwards from a side of the receiving slot 121 adjacent to the lateral surface 13 to show an inverted L shape. The second soldering recess 122 passes through a rear portion of the lateral surface 151 and is spaced away from the first soldering recess 153.

Figure 2:
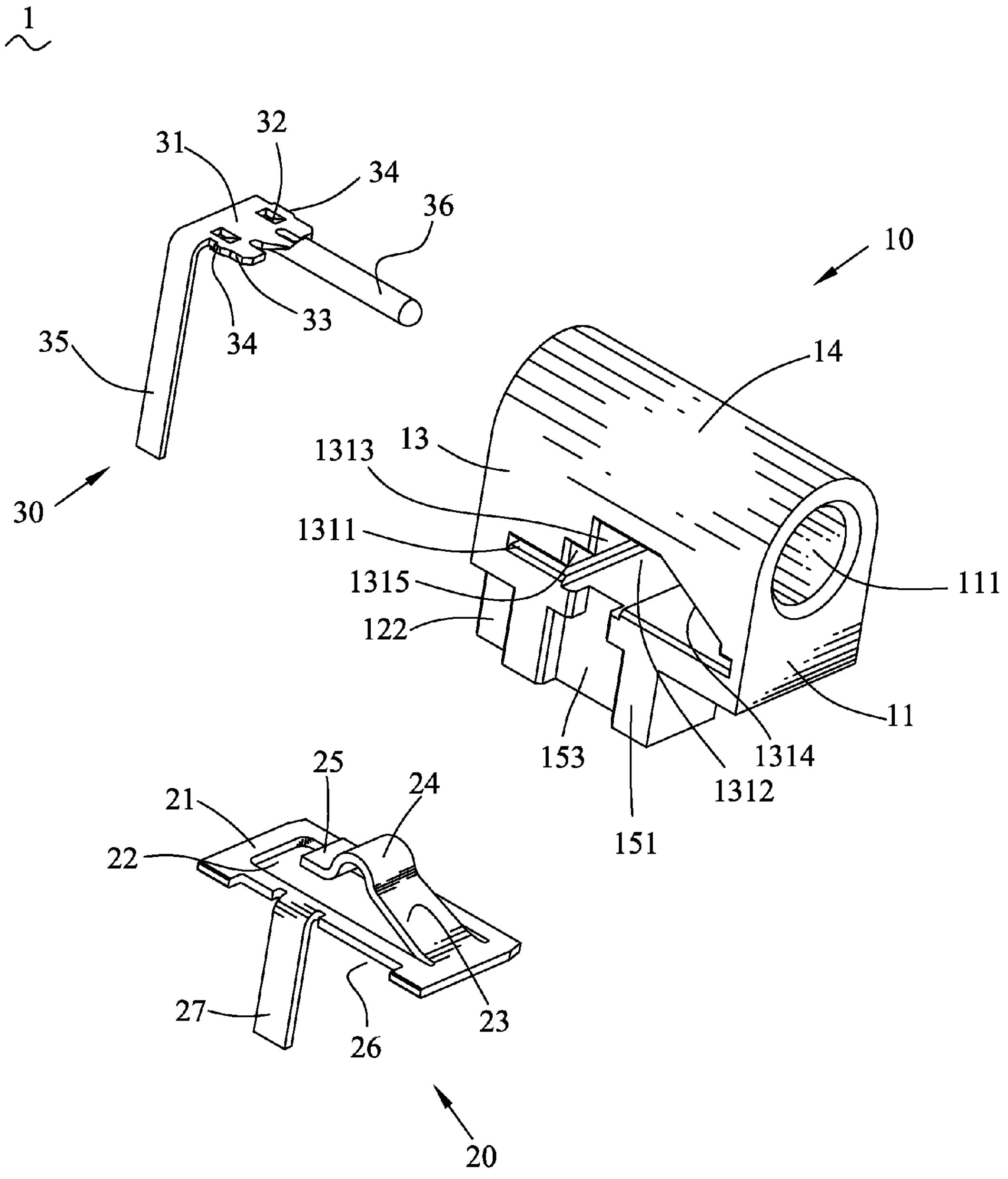
FIG. 2 is a an exploded, perspective view of the socket connector shown in FIG. 1.
Figure 3:
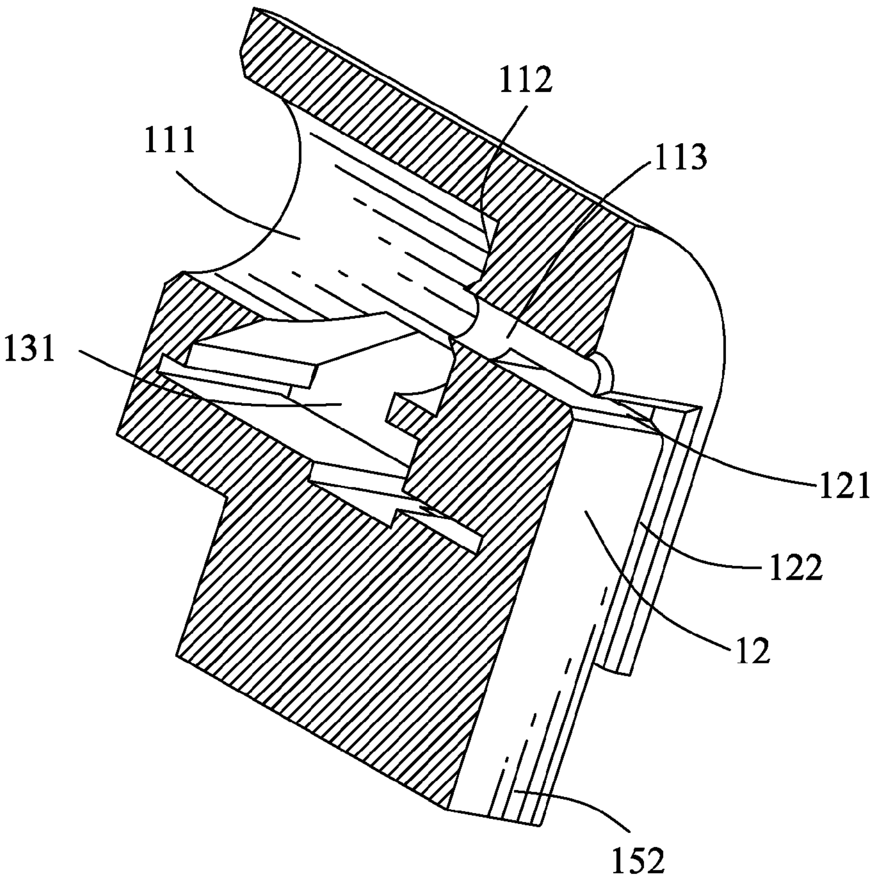
FIG. 3 is a cross-sectional view of an insulating housing of the socket connector shown in FIG. 1.
Figure 4:
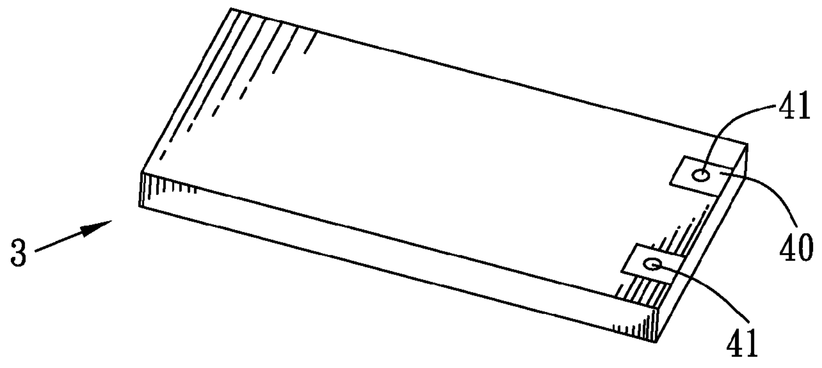
FIG. 4 is a perspective view of a printed circuit board of the connector assembly.

Please refer to FIG. 2 and FIG. 3, the first terminal 20 has a substantial rectangular base plate 21. The base plate 21 has a rectangular hole 22 at a substantial middle portion thereof and passing therethrough. A front side of the hole 22 is extended rearward and upwardly to form a connecting arm 23. The connecting arm 23 has a free end arched to form a contacting portion 24 of inverted C-shape. A free end of the contacting portion 24 extends rearwards to form a resting patch 25, with a free end thereof spaced away from a rear side of the hole 22. A side of the base plate 21 has a portion concaved inwards to form a gap 26. The gap 26 has a first soldering plate 27 extended downwards from a middle of an inmost side thereof, corresponding to the first soldering recess 153.

The second terminal 30 has a substantial rectangular fixing plate 31 and a cylindrical center pin 36 disposed at a middle of a front end of the fixing plate 31. The fixing plate 31 is punched with two buckling tabs 32 spaced away from each other. The fixing plate 31 has two opposite lateral edges 33. Each of the lateral edges 33 has a middle portion protruded laterally to form a protrusion 34. A second soldering plate 35 is bent downwards and perpendicularly from a rear end of one of the lateral edges 33, spaced away from the protrusion 34.

Figure 1:
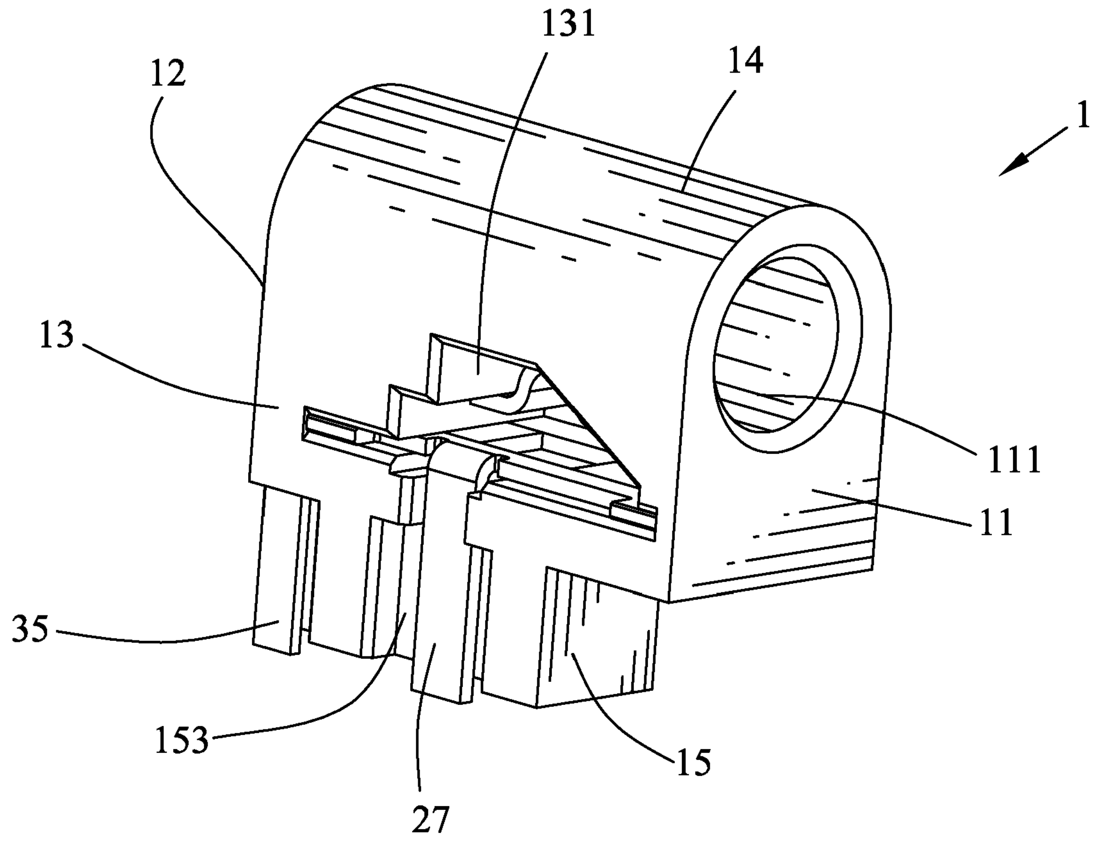
FIG. 1 is an assembled, perspective view of a socket connector of a connector assembly according to the present invention.

With reference to FIG. 1 and FIG. 5, in assembly, the first terminal 20 is received into the receiving groove 131. The base plate 21 inserts into the fixing slot 1311, and the resting patch 25 abuts against the stopping recess 1315, which makes the first terminal 20 steadily positioned in the receiving groove 131. The contacting portion 24 is received in the connecting groove 1312 and partially projects into the inserting recess 111. The first soldering plate 27 is restrained in the first soldering recess 153. The center pin 36 of the second terminal 30 is inserted into the through hole 113 from a rear direction, with a free end thereof extending into the inserting recess 111. The fixing plate 31 is fixed in the receiving slot 121 of the insulating housing 10 by the buckling tabs 32 and the protrusions 34 buckled with the receiving slot 121. The second soldering plate 35 is received in the second soldering recess 122, with a lower portion thereof exposed outside.

With reference to FIG. 1 and FIG. 5, the printed circuit board (PCB) 3 is a rectangular shape and has two soldering portions 40 at a front end thereof and spaced away from each other. Each of the soldering portions 40 is provided with a soldering hole 41.

With reference to FIG. 5, when the socket connector 1 is connected with the PCB 3, two free ends of the two conductors 2 are soldered on the first soldering plate 27 of the first terminal 20 and the second soldering plate 35 of the second terminal 30, and the other two opposite ends of the conductors 2 are soldered into the soldering holes 41 of the soldering portions 40, respectively. Thus the socket connector 1 and the PCB 3 are connected by the conductors 2 therebetween. In this embodiment, the column-shaped conductors 2 are rigid and flexible.

As described above, the socket connector 1 is soldered on the PCB 3 by the conductors 2, without stacking the socket connector 1 on a top of the PCB 3, which makes the PCB 3 dispose at any required position in an electronic device (not shown). So the assembling structure is simple and flexible and meets the tendency towards miniaturization and multifunction of the electrical device.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A connector assembly adapted for electrically connecting with a mating plug connector, comprising:

a socket connector, comprising:

an insulating housing defining a front surface, a rear surface opposite to the front surface, and a lateral surface connecting with the front surface and the rear surface, the front surface being formed with an inserting recess for receiving the mating plug connector, the lateral surface having a receiving groove communicating with the inserting recess, the rear surface having a receiving slot communicating with the inserting recess;

a first terminal having a base plate received in the receiving groove, a contacting portion projecting into the inserting recess, and a first soldering plate exposing outside the insulating housing; and a second terminal having a fixing plate fixed in the receiving slot, a center pin prolonging into the inserting recess, and a second soldering plate exposing outside the insulating housing;

a printed circuit board defining two soldering portions; and two conductors for connecting the first soldering plate and the second soldering plate with the two soldering portions respectively, and capable of altering the relative position between the socket connector and the printed circuit board.

2. The connector assembly as claimed in claim 1, wherein the receiving groove includes a substantial rectangular fixing slot, and a connecting groove above and communicating with the fixing slot, the base plate received in the fixing slot has a rectangular hole at a middle portion thereof, a front side of the hole is extended rearwards and upwardly to form a connecting arm received in the connecting groove, a free end of the connecting arm is arched to form the contacting portion.

3. The connector assembly as claimed in claim 2, wherein the connecting groove has a first surface adjacent to the rear surface, the first surface has a lower portion formed with a stopping recess, the contacting portion has a free end extended back to the connecting arm to form a resting patch buckling with the stopping recess.

4. The connector assembly as claimed in claim 2, wherein the first soldering plate is extended perpendicularly and downwardly from a side of the base plate, a bottom of the insulating housing is protruded downwards to form a projecting block, the projecting block has a surface which is substantially flush with the lateral surface and formed with a first soldering recess, the first soldering recess communicating with the fixing slot for receiving the first soldering plate.

5. The connector assembly as claimed in claim 4, wherein the projecting block has a second soldering recess rearward of the first soldering recess, the second soldering recess penetrates the insulating housing and passes through an end of a bottom of the receiving slot, the second soldering plate is extended downwards from a side of the fixing plate and received in the second soldering recess.

6. The connector assembly as claimed in claim 5, wherein the conductors are column-shaped and have free ends fixed to the first soldering plate, the second soldering plate and the soldering portions, respectively.

7. The connector assembly as claimed in claim 1, wherein the inserting recess defines a bottom surface, the bottom surface has a through hole intercommunicating with the receiving slot, for allowing the center pin of the second terminal passing therethrough, with a free end thereof extending into the inserting recess.

8. The connector assembly as claimed in claim 1, wherein the fixing plate has two spaced buckling tabs buckling with a side of the receiving slot for fixing the fixing plate therein the receiving slot.

9. The connector assembly as claimed in claim 1, wherein each of two opposite lateral edges of the fixing plate is projected laterally to form a protrusion, buckling with a side of the receiving slot for fixing the fixing plate in the receiving slot.

10. The connector assembly as claimed in claim 9, wherein the second soldering plate is arranged rearward of the protrusion.

* * * * *